(12) United States Patent
Chen et al.

(10) Patent No.: US 11,574,895 B2
(45) Date of Patent: Feb. 7, 2023

(54) METHOD OF MANUFACTURING ELECTRONIC DEVICE

(71) Applicant: InnoLux Corporation, Miao-Li County (TW)

(72) Inventors: Jia-Yuan Chen, Miao-Li County (TW); Tsung-Han Tsai, Miao-Li County (TW); Kuan-Feng Lee, Miao-Li County (TW); Yuan-Lin Wu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 445 days.

(21) Appl. No.: 16/720,917

(22) Filed: Dec. 19, 2019

(65) Prior Publication Data

US 2021/0193630 A1 Jun. 24, 2021

(51) Int. Cl.
*H01L 25/075* (2006.01)
*H01L 27/32* (2006.01)
*H01L 33/00* (2010.01)
*H01L 27/15* (2006.01)
(Continued)

(52) U.S. Cl.
CPC ........ *H01L 25/0753* (2013.01); *H01L 27/156* (2013.01); *H01L 27/3244* (2013.01); *H01L 33/0095* (2013.01); *H01L 33/62* (2013.01); *H01L 21/6835* (2013.01); *H01L 2221/68322* (2013.01); *H01L 2221/68363* (2013.01); *H01L 2221/68372* (2013.01)

(58) Field of Classification Search
CPC ............... H01L 25/0753; H01L 27/156; H01L 21/6835; H01L 21/67144; H01L 2221/68322; H01L 2221/68363; H01L 2221/68368
See application file for complete search history.

(56) References Cited

U.S. PATENT DOCUMENTS 10,002,928 B1 6/2018 Raring et al.
10,325,888 B2 * 6/2019 Lai .................... H01L 24/97
10,510,923 B2 * 12/2019 An .................... H01L 23/544
(Continued)

OTHER PUBLICATIONS

Extended European Search Report dated May 10, 2021, issued in application No. EP 20212761.9.

*Primary Examiner* — Errol V Fernandes
*Assistant Examiner* — Jeremy J Joy
(74) *Attorney, Agent, or Firm* — McClure, Qualey & Rodack, LLP (57) ABSTRACT

A method of manufacturing an electronic device, comprising: providing a carrier substrate with a plurality of light-emitting units disposed thereon, the plurality of light-emitting units being spaced with a first pitch (P1) in a first direction and a second pitch (P2) in a second direction that is perpendicular to the first direction; providing a driving substrate; and transferring at least a portion of the plurality of light-emitting units to the driving substrate to form a transferred portion of the plurality of light-emitting units on the driving substrate, the transferred portion being spaced with a third pitch (P3) in a third direction and a fourth pitch (P4) in a fourth direction that is perpendicular to the third direction; wherein the first pitch (P1), the second pitch (P2), the third pitch (P3), and the fourth pitch (P4) are satisfied following relations: P3=mP1; and P4=nP2, m and n are positive integers.

10 Claims, 11 Drawing Sheets (51) Int. Cl.
*H01L 33/62* (2010.01)
*H01L 21/683* (2006.01)

(56) References Cited

U.S. PATENT DOCUMENTS

| | | | |
|---|---|---|---|
| 2003/0162463 A1* | 8/2003 | Hayashi | H01L 24/18 |
| | | | 445/24 |
| 2010/0259164 A1* | 10/2010 | Oohata | H01L 25/0753 |
| | | | 445/24 |
| 2012/0092389 A1* | 4/2012 | Okuyama | H01L 25/0753 |
| | | | 257/89 |
| 2014/0120640 A1* | 5/2014 | Shieh | H01L 21/68757 |
| | | | 156/542 |
| 2017/0256522 A1 | 9/2017 | Cok et al. | |
| 2017/0358503 A1* | 12/2017 | Liu | B65G 43/08 |
| 2017/0373046 A1* | 12/2017 | Gardner | H01L 21/6835 |
| 2018/0158806 A1* | 6/2018 | Lai | H01L 24/97 |
| 2019/0073944 A1 | 3/2019 | Li | |
| 2019/0157501 A1* | 5/2019 | An | H01L 21/6835 |
| 2019/0157502 A1* | 5/2019 | Moon | H01L 27/153 |
| 2020/0235076 A1* | 7/2020 | Batres | H01L 21/6835 |
| 2020/0274039 A1* | 8/2020 | Chen | H01L 25/0753 |
| 2020/0395348 A1* | 12/2020 | Kwag | H01L 33/50 |
| 2021/0013184 A1* | 1/2021 | Kwon | H01L 25/0753 |
| 2021/0288209 A1* | 9/2021 | Kwag | H01L 33/005 |

\* cited by examiner

METHOD OF MANUFACTURING ELECTRONIC DEVICE

BACKGROUND OF THE INVENTION

Field of the Invention

The application relates in general to a method of manufacturing an electronic device, and in particular to a method that includes a step of transferring a plurality of light-emitting units.

Description of the Related Art

Thanks to ongoing technological developments, recent electronic devices such as high-quality display screens usually include a plurality of LED (Light-emitting Diode) chips, which can provide 4K image quality. However, during the manufacturing of such electronic devices, the higher the desired display quality, the more LED chips are required. For example, a 4K display screen has more than 24 million LED chips. It means that there are many LED chips that need to be transferred and set on a driving substrate. Therefore, how to provide a way to efficiently transfer LED chips from a carrier substrate to a driving substrate is an important issue.

BRIEF SUMMARY OF INVENTION

To address the deficiencies of conventional products, an embodiment of the disclosure provides a method of manufacturing an electronic device, comprising: providing a carrier substrate with a plurality of light-emitting units disposed thereon, the plurality of light-emitting units being spaced with a first pitch (P1) in a first direction and a second pitch (P2) in a second direction that is perpendicular to the first direction; providing a driving substrate; and transferring at least a portion of the plurality of light-emitting units to the driving substrate to form a transferred portion of the plurality of light-emitting units on the driving substrate, the transferred portion being spaced with a third pitch (P3) in a third direction and a fourth pitch (P4) in a fourth direction perpendicular to the third direction; wherein the first pitch (P1), the second pitch (P2), the third pitch (P3), and the fourth pitch (P4) are satisfied following relations: P3=mP1; and P4=nP2, m and n are positive integers.

BRIEF DESCRIPTION OF DRAWINGS

The disclosure can be more fully understood by reading the subsequent detailed description and examples with references made to the accompanying drawings, wherein.

DETAILED DESCRIPTION OF INVENTION

The making and using of the embodiments of the methods of manufacturing an electronic device are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Unless defined otherwise, all technical and scientific terms used herein have the same meaning as commonly understood to one of ordinary skill in the art to which this invention belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

It should be noted that the electronic device may include a display device, an antenna device, a sensing device, or a tiled device, but is not limited thereto. The electronic device can be a bendable or flexible electronic device. The electronic device may include, for example, a light-emitting diode; the light-emitting diode may include, for example, an organic light-emitting diode (OLED), a sub-millimeter light-emitting diode (mini LED), and a micro light-emitting diode (micro LED) or a quantum dot (QD) light-emitting diode (which may be, for example, QLED or QDLED), fluorescence, phosphor, or other suitable material, and the materials thereof may be arbitrarily arranged and combined, but is not limited thereto. The antenna device can be, for example, a liquid crystal antenna, but is not limited thereto. The tiled device can be, for example, a display tiled device or an antenna tiled device, but is not limited thereto. It should be noted that the electronic device may be any combination of the foregoing, but is not limited thereto.

First Embodiment

Figure 1:
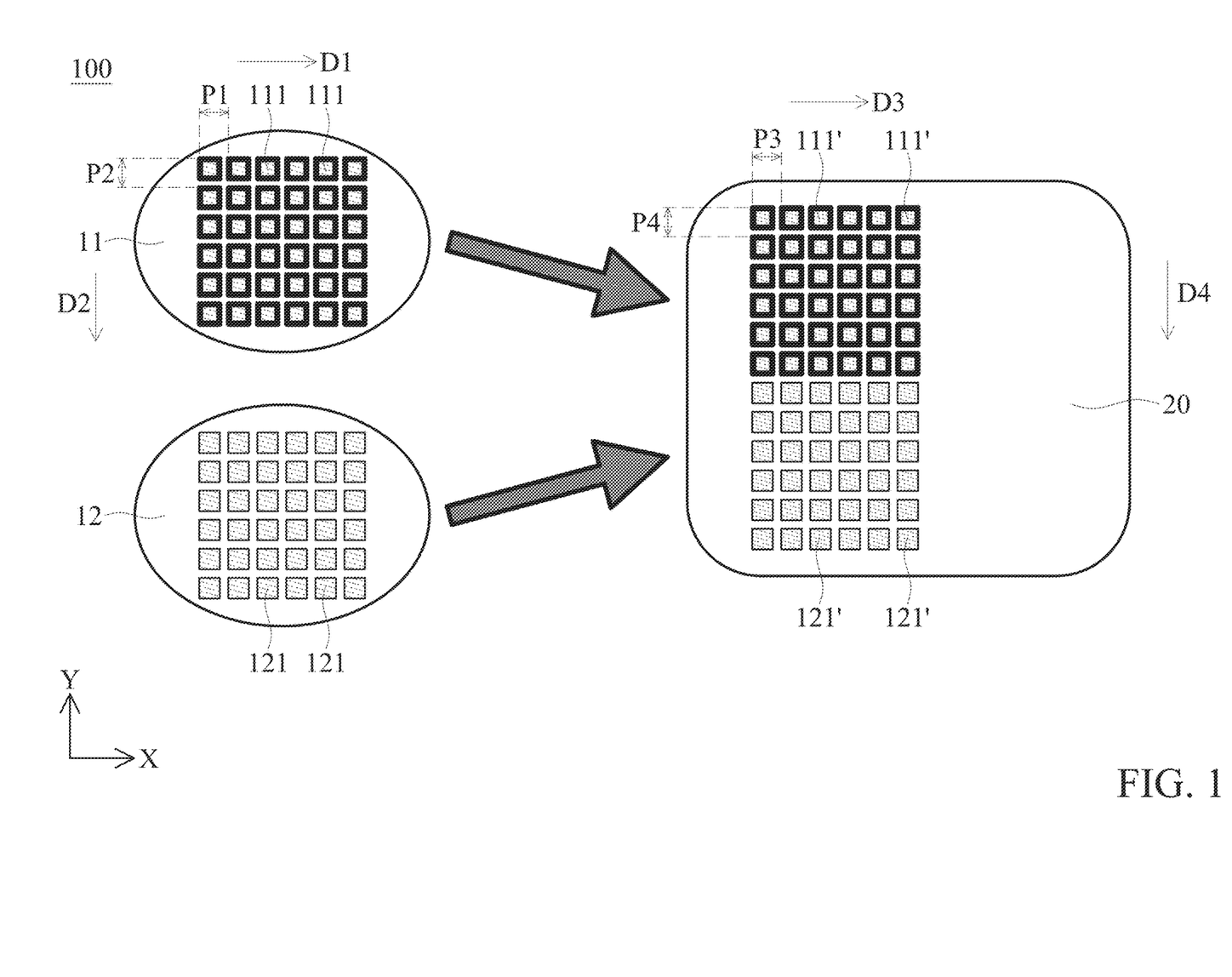
FIG. 1 is a schematic diagram of a system of manufacturing an electronic device according to an embodiment of the present disclosure.

Referring to FIG. 1, FIG. 1 is a schematic diagram of a system 100 of manufacturing an electronic device. The system 100 comprises at least one carrier substrate 11 and a driving substrate 20. In the present embodiment, the carrier substrate 11 is a processing-transition substrate which can holds the light-emitting units 111. The driving substrate 20 may be an AM (Active Matrix, ex. array substrate with TFT) substrate or a PM (Passive Matrix) substrate, which can be used to a substrate of a display device. A plurality of light-emitting units 111 (such as LED chips) are disposed on the carrier substrate 11, wherein the light-emitting units 111 are transferred from the carrier substrate 11 to the driving substrate 20, for example, by way of adhesive (e.g. carrier substrate 11 and driving substrate 20 are attached to each other) or via a gripping head (e.g. a transferring member 30 in FIG. 7D). In some embodiments, the driving substrate 20 has stronger adhesion to the light-emitting units 111 than the carrier substrate 11. When the carrier substrate 11 and the driving substrate 20 are attached together (with the light-emitting units 111 between them), the light-emitting units 111 can be transferred to the driving substrate 20 from the carrier substrate 11. In some embodiments, light-emitting unit 111 may be a single color light-emitting unit, such as a red, green or blue light-emitting unit, or it can be an integrated RGB light-emitting unit.

Regarding to the light-emitting units 111 on the carrier substrate 11, the two adjacent light-emitting units 111 being spaced from each other with a first pitch P1 in a first direction D1 (X-axis) and a second pitch P2 in a second direction D2 (Y-axis) different from the first direction D1. In one embodiment, the second direction D2 is perpendicular to the first direction D1. By using an adhesion or a gripping head, the light-emitting units 111 can be transferred and disposed on the driving substrate 20 to form a transferred portion of the light-emitting units (transferred light-emitting units) 111'. It should be note that the two adjacent transferred light-emitting units 111' is spaced from each other with a third pitch P3 in a third direction D3 (X-axis) and a fourth pitch P4 in a fourth direction D4 (Y-axis) different from the third direction D3. In one embodiment, the fourth direction D4 is perpendicular to the third direction D3. In this embodiment, the pitches P3 and P4 of the light-emitting units 111' are respectively equal to the pitches P1 and P2 of the light-emitting units 111.

In some embodiments, the system 100 of manufacturing an electronic device may further comprises another carrier substrate 12, also shown in FIG. 1. The light-emitting units 111 and 121 on the respectively carrier substrates 11 and 12 can be transferred to the same driving substrate 20, that is the transferred light-emitting units 111' and 121'. Therefore, it means that the driving substrate 20 can carry a plurality of light-emitting units which are transferred from different carrier substrates.

According to the carrier substrate area and driving substrate area for light-emitting units, and the densities of light-emitting units in carrier substrate 11 and driving substrate 20, the amount of carrier substrates can be found by:

$$y * \frac{d1}{d2} = \frac{A2}{A1} \quad (1)$$

In the formula (1), "d1" and "d2" represent the "light-emitting units density on the carrier substrate" and the "light-emitting units density on the driving substrate"; "A1" and "A2" represent the "area occupied by the light-emitting units on the carrier substrate" and the "area occupied by the light-emitting units on the driving substrate area"; and "y" represents the amount of carrier substrates. Therefore, by this formula (1), the required quantity for carrier substrates can be calculated.

Second Embodiment

Figure 2A:
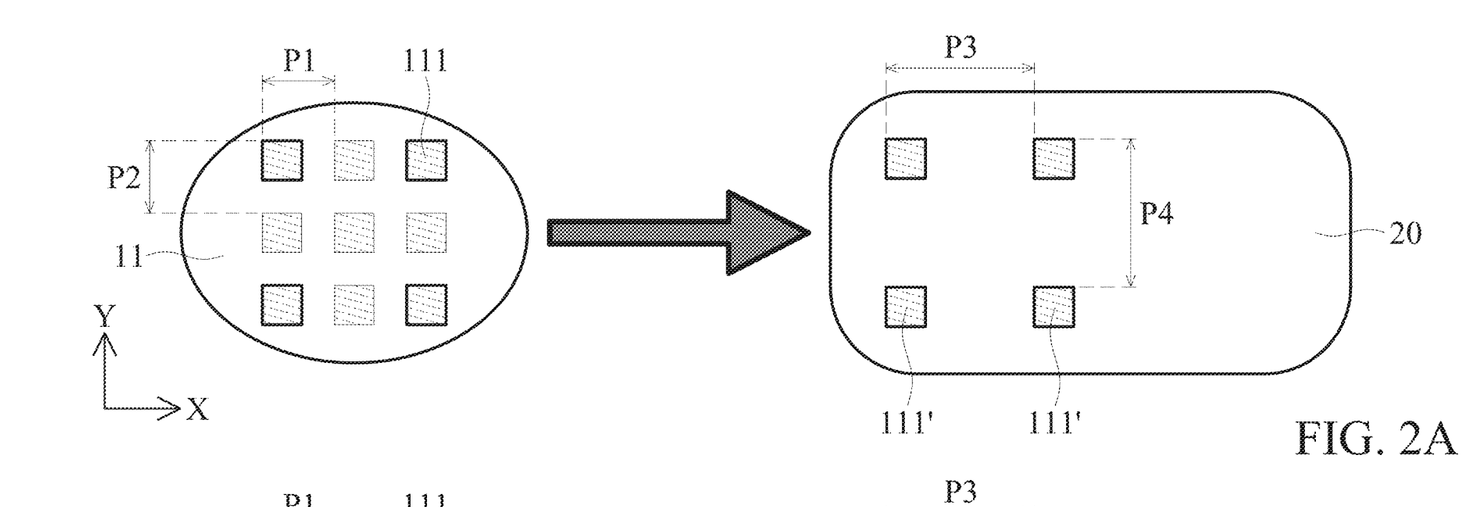
FIG. 2A is a schematic diagram of a system of manufacturing an electronic device according to another embodiment of the present disclosure.

In some embodiments, a portion of the light-emitting units 111 are transferred, and the pitches P3 and P4 may not totally equal to the pitches P1 and P2. For example, in FIG. 2A, the light-emitting units 111 on the carrier substrate 11 has the first pitch P1 (X-axis) and the second pitch P2 (Y-axis). After the light-emitting units 111 have been transferred, the transferred light-emitting units 111' on the driving substrate 20 has the third pitch P3 (X-axis) and the fourth pitch P4 (Y-axis), wherein P3 is twice as large as P1 (i.e. P3=2P1), and P4 is twice as large as P2 (i.e. P4=2P2). Therefore, by transferring the light-emitting units which are located at specific positions, the pitches (P3 and P4) of the transferred light-emitting units can be adjusted.

Figure 2B:
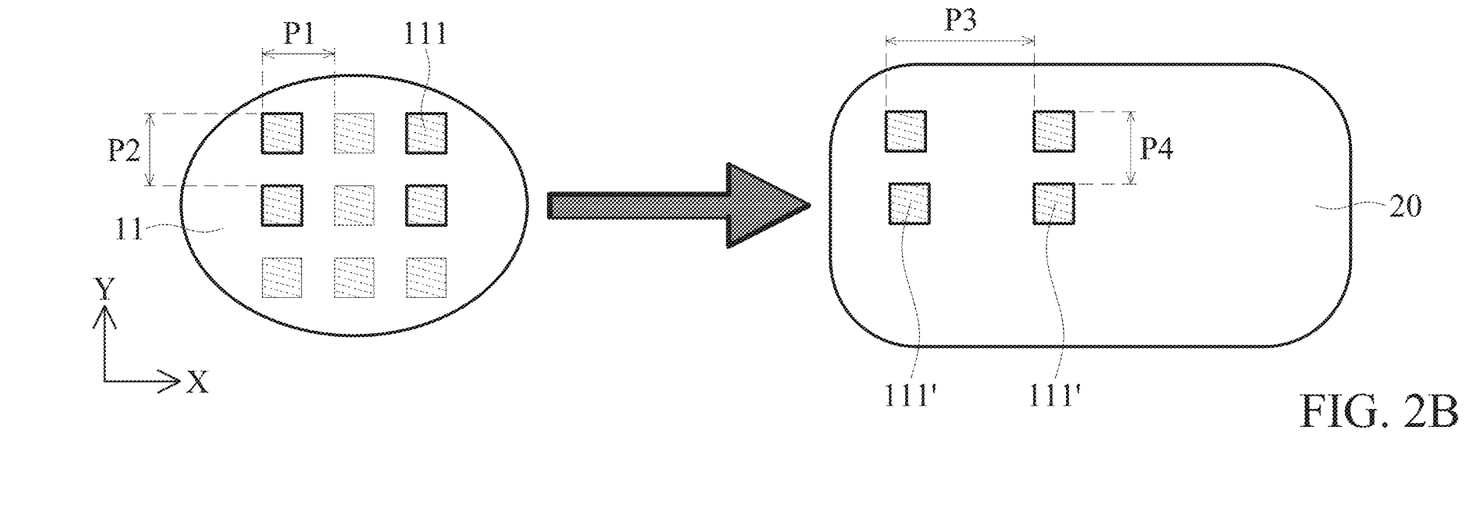
FIG. 2B is a schematic diagram of a system of manufacturing an electronic device according to another embodiment of the present disclosure.

In some embodiments, as shown in FIG. 2B, the transferred light-emitting units 111' on the driving substrate 20 has the third pitch P3 (X-axis) and the fourth pitch P4 (Y-axis), wherein P3 is twice as large as P1 (i.e. P3=2P1), and P4 is same to P2 (i.e. P4=P2). In some embodiments, the P3 can be a positive integer multiple of P1, and P4 can be a positive integer multiple of P2. By transferring the light-emitting units which are located at specific positions, the pitches (P3 and P4) of the transferred light-emitting units can be adjusted. Therefore, by adjusting the pitches (different directions) of the transferred light-emitting units, the electronic device is more flexible in the manufacturing process which can improve the process efficiency or the product quality.

Figure 2C:
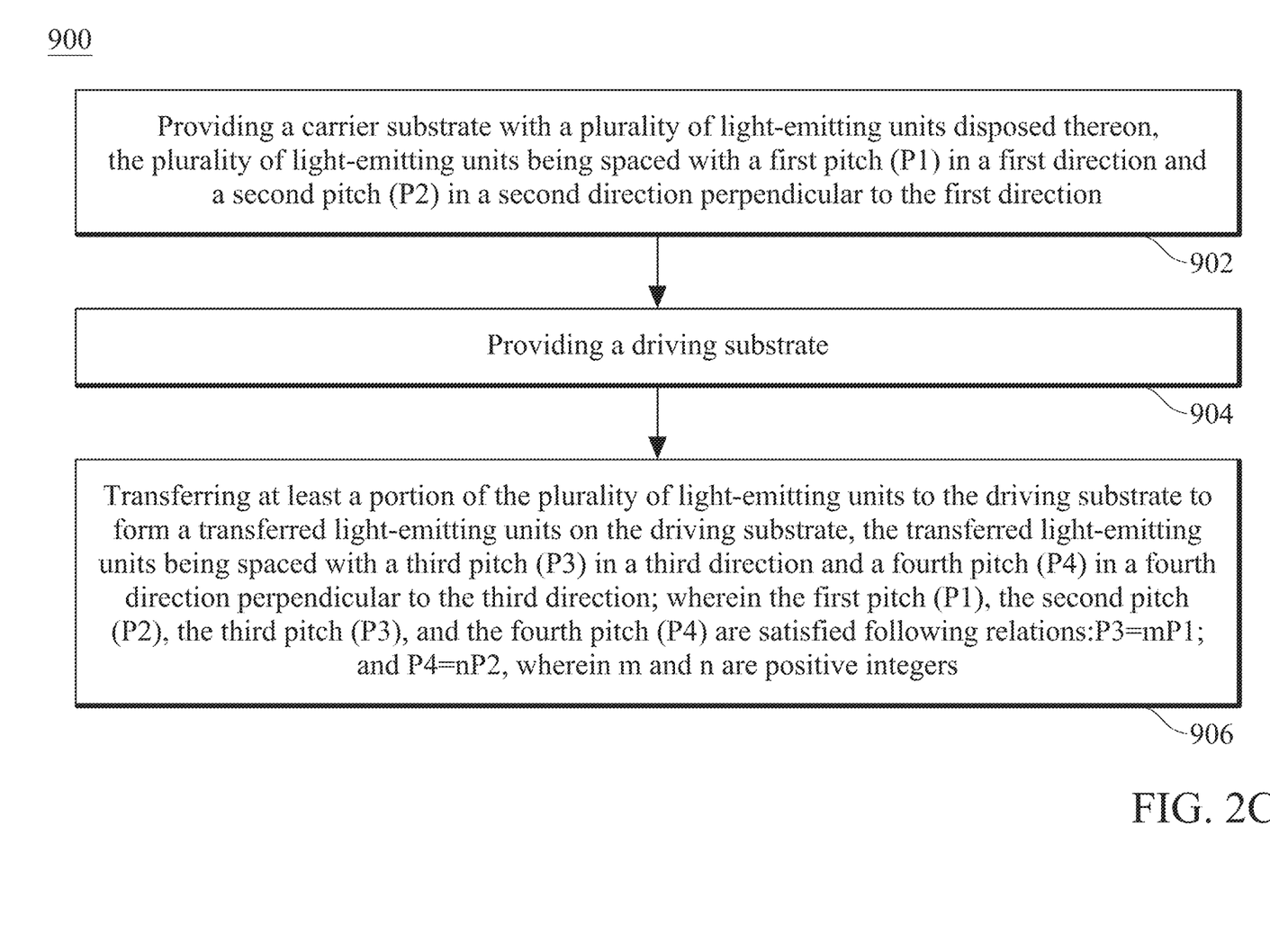
FIG. 2C is a schematic diagram of a method of manufacturing an electronic device according to another embodiment of the present disclosure.

According to the description of the foregoing embodiments, including the first and second embodiments, the present disclosure provides a method for manufacturing an electronic device 900, as shown in FIG. 2C, which mainly includes: providing a carrier substrate with a plurality of light-emitting units disposed thereon, the plurality of light-emitting units being spaced with a first pitch (P1) in a first direction and a second pitch (P2) in a second direction perpendicular to the first direction (step 902); providing a driving substrate (step 904); and transferring at least a portion of the plurality of light-emitting units to the driving substrate to form a transferred light-emitting units on the driving substrate, the transferred light-emitting units being spaced with a third pitch (P3) in a third direction and a fourth pitch (P4) in a fourth direction perpendicular to the third direction; wherein the first pitch (P1), the second pitch (P2), the third pitch (P3), and the fourth pitch (P4) satisfy following relations:P3=mP1; and P4=nP2, m and n are positive integers (step 906).

In step 902, the light-emitting units are spaced with the first and second pitches P1 and P2. In step 906, the transferred light-emitting units are spaced with the third and fourth pitches P3 and P4, wherein P3=mP1; and P4=nP2, wherein m and n are positive integers. In some embodiments, m is equal to n; or m and n are all equal to 1. In some embodiments, the step of transferring at least a portion of the plurality of light-emitting units is via non-selective transferred (m and n are all equal to 1). In some embodiments, at least one of m and n is greater than 1. In some embodiments, m is different from n. In some embodiments, the step of transferring at least a portion of the plurality of light-emitting units is via selective transferred (at least one of m and n is greater than 1).

Third Embodiment

Figure 3A:
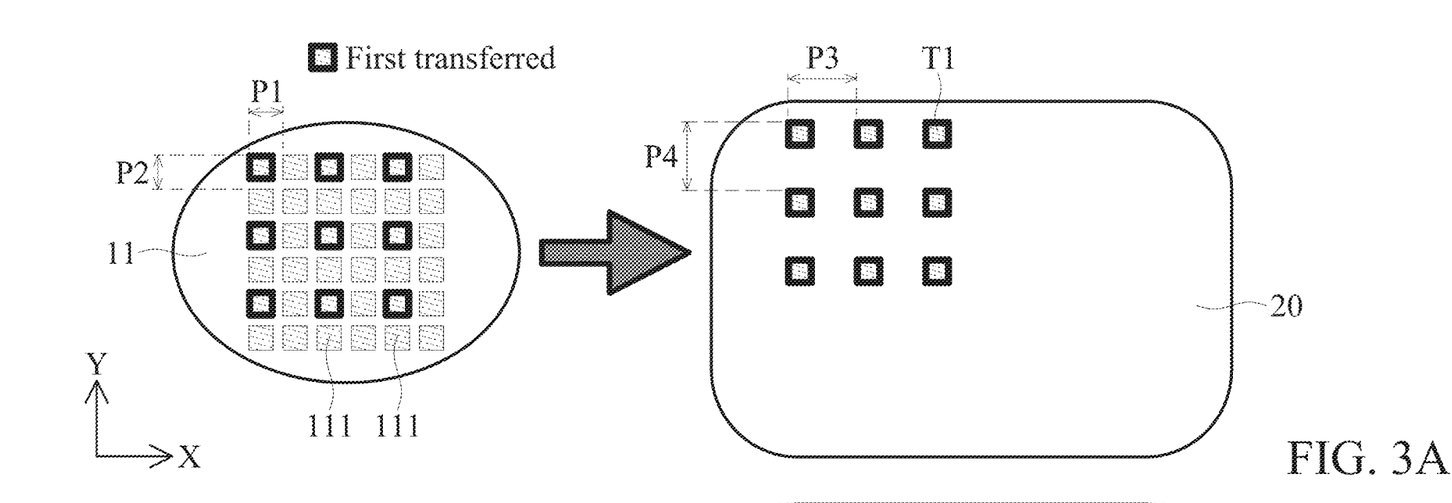
FIGS. 3A to 3D are schematic diagrams of the light-emitting units transferred to the driving substrate from the carrier substrate according to another embodiment of the present disclosure.
Figure 3B:
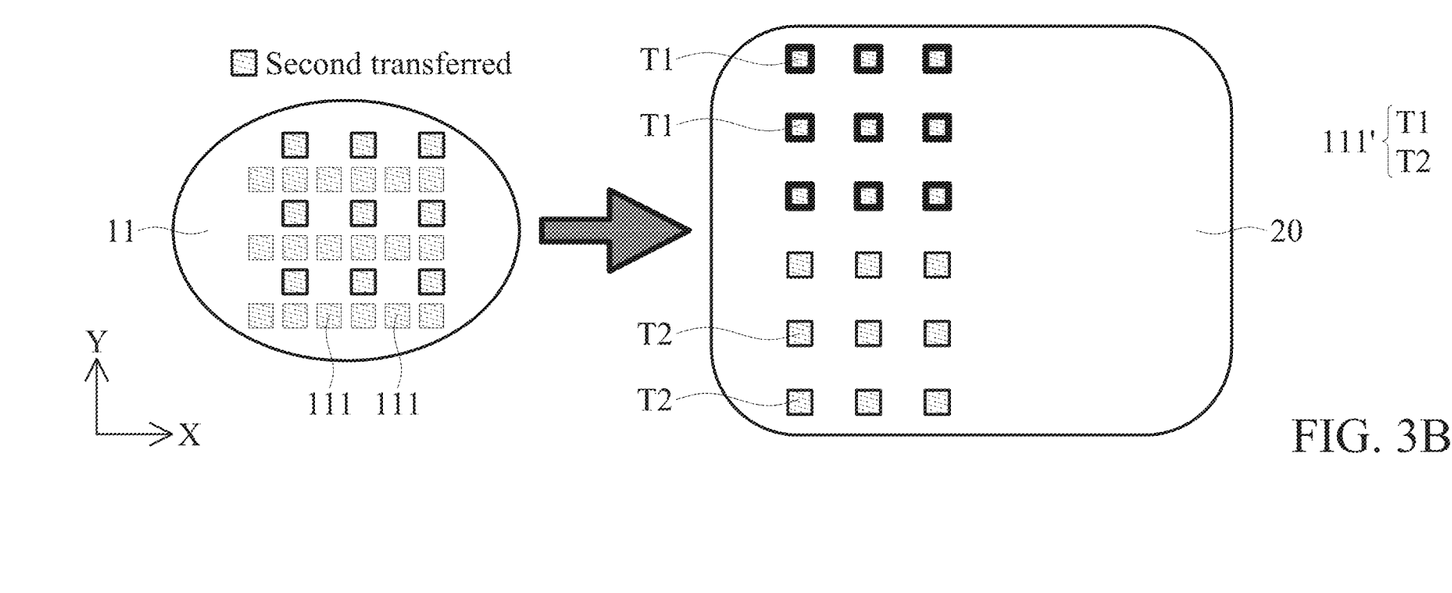
Figure 3C:
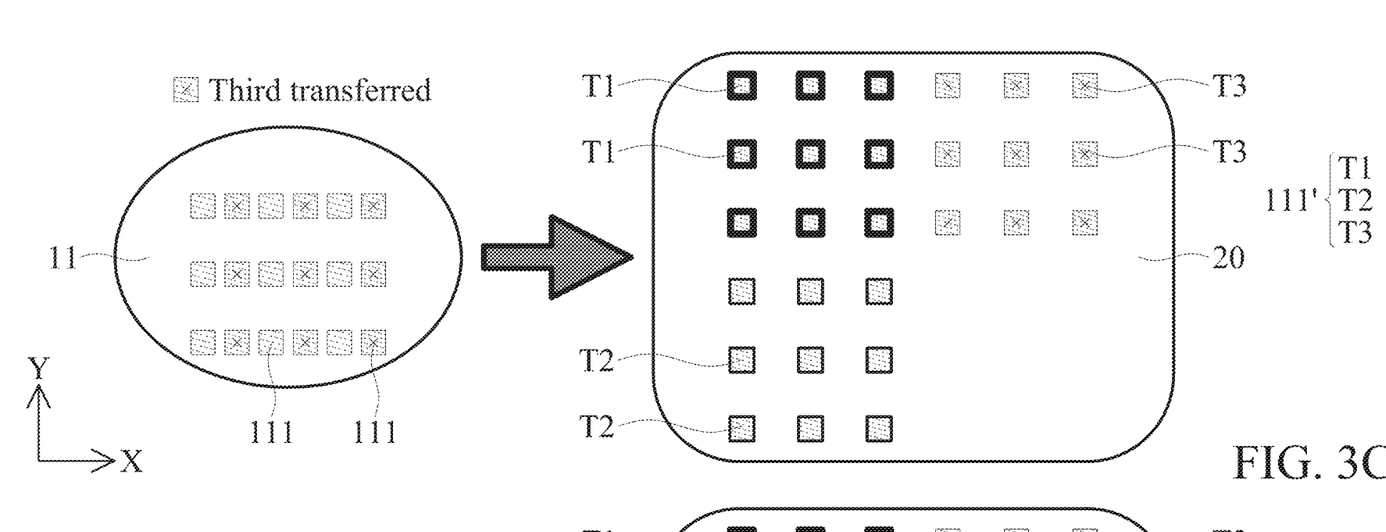
Figure 3D:
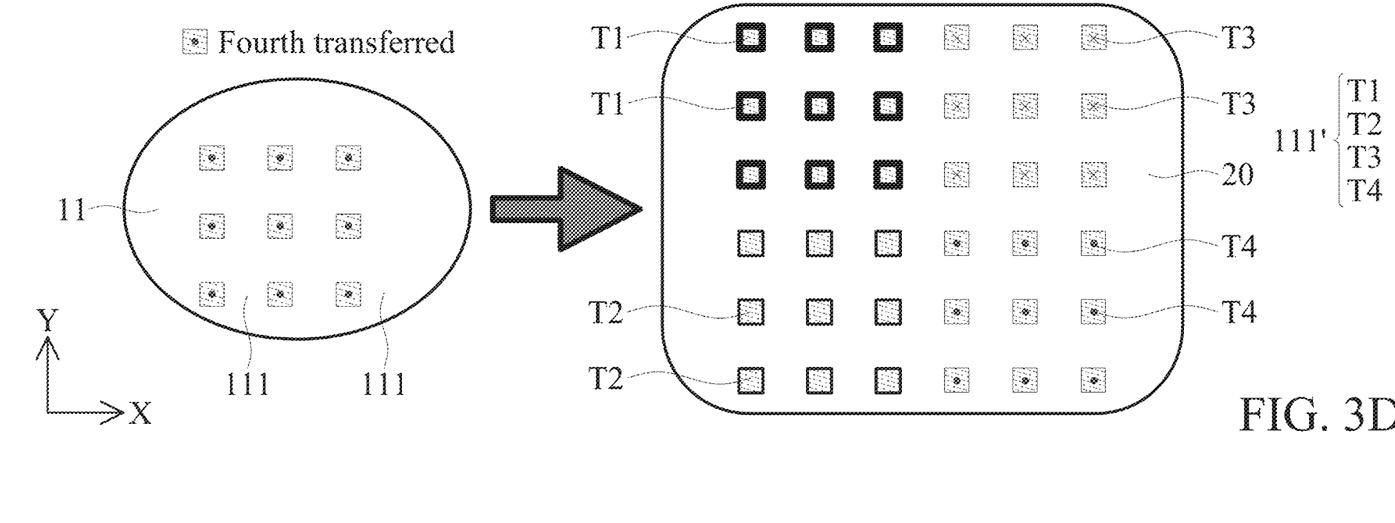

FIGS. 3A to 3D show schematic diagrams of the light-emitting units 111 on the carrier substrate 11 undergoing a plurality of transferring processes. As shown in FIG. 3A, a portion of the light-emitting units 111 labeled with "First transferred" are selected to be transferred to the driving substrate 20 as the first transferred light-emitting units T1. Then, as shown in FIG. 3B, the other labeled "Second transferred" light-emitting units 111 are selected to be transferred to the driving substrate 20 as the second transferred light-emitting units T2. After then, as shown in FIGS. 3C and 3D, the third transferred light-emitting units T3 and the fourth transferred light-emitting units T4 are sequentially transferred from the carrier substrate 11 to the driving substrate 20.

By selective transferring process, the light-emitting units 111 are successfully transferred to the driving substrate 20 with the pitch P3 in the X-axis and the pitch P4 in the Y-axis. In this embodiment, P3=2P1 and P4=2P2.

Fourth Embodiment

Figure 4A:
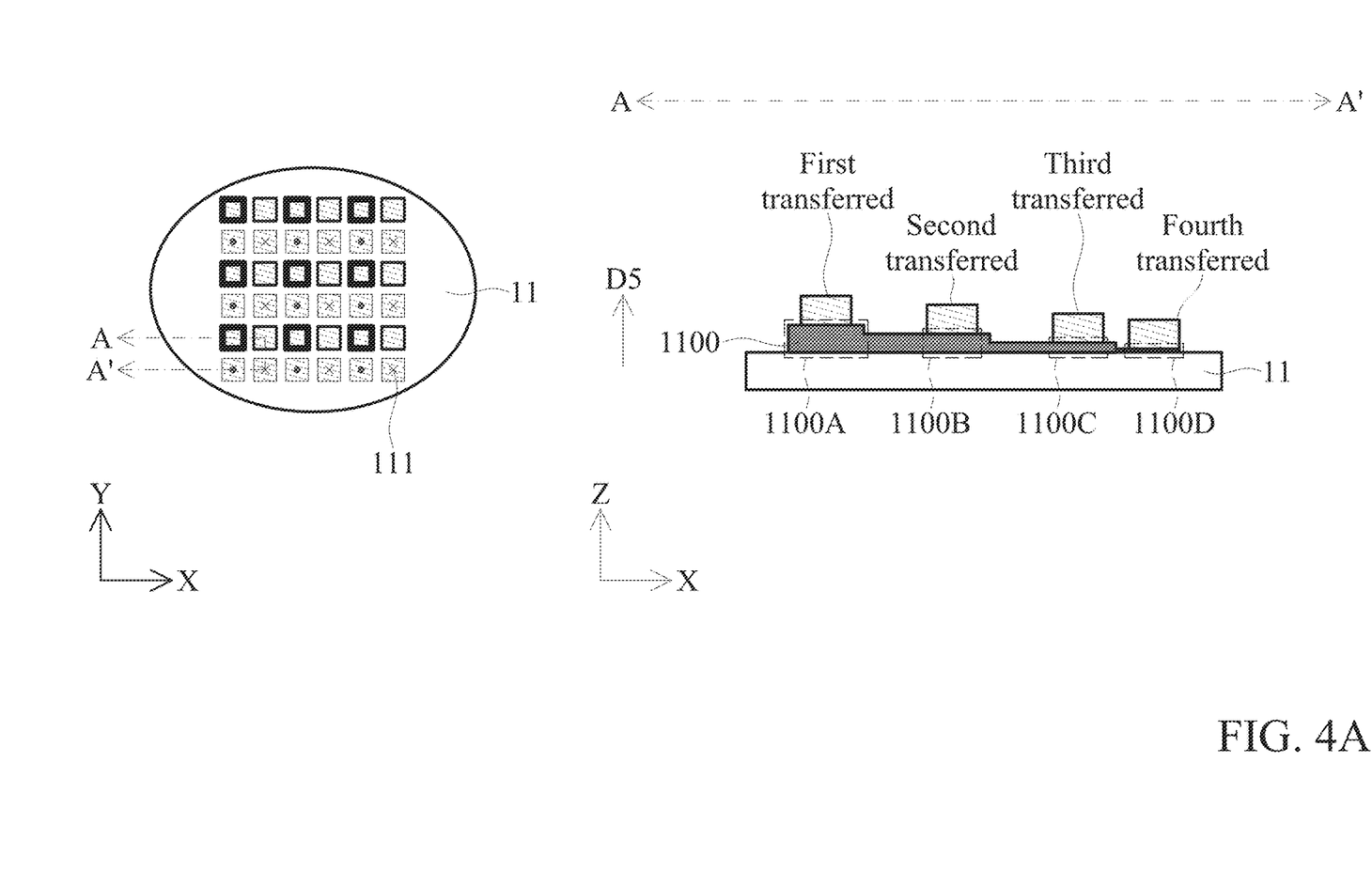
FIG. 4A is a schematic and cross-sectional diagram of the light-emitting units, the buffer layer and the carrier substrate.

In some embodiments, before the light-emitting unit 111 to be transferred, there is a buffer layer 1100 formed between the light-emitting units 111 and the carrier substrate 11, as shown in FIG. 4A. The buffer layer 1100 may comprise inorganic material or organic material. In some embodiments, the inorganic material may include, but is not limited to, silicon nitride, silicon oxide, silicon oxynitride, aluminum oxide. In some embodiments, the organic material may include, but is not limited to, epoxy resins, acrylic resins such as polymethylmetacrylate (PMMA), benzocyclobutene (BCB), polyimide, and polyester, polydimethylsiloxane (PDMS) or polyfluoroalkoxy (PFA). The buffer layer 1100, for example, can be formed via an etching process and has a plurality of regions with different heights in a fifth direction D5 (Z-axis).

In the present embodiment, the buffer layer 1100 has a plurality of regions 1100A to 1100D, wherein different regions have different heights in a fifth direction D5 (Z-axis) perpendicular to the first and second directions. In particular, as the cross-regional view along the line A-A' (shown in FIG. 4A), the buffer layer 1100 in the region 1100A (between the carrier substrate 11 and the First transferred) has the largest height in the Z-axis. The heights of the buffer layer 1100 respectively in the regions 1100B/1100C (between the carrier substrate 11 and the Second transferred and the Third transferred) are smaller than the height of the buffer layer 1100 in the region 1100A. The buffer layer 1100 in the region 1100D (between the carrier substrate 11 and the Fourth transferred) has the lowest height in the Z-axis.

In some embodiments, the buffer layer can be a multi-layer structure which is provided between the light-emitting units 111 and the carrier substrate 11, which also forms a plurality of regions with different heights in Z-axis. In some embodiments, the region 1100D may have one buffer layer; the region 1100C may have two buffer layers; the region 1100B may have three buffer layers; and the region 1100A may have four buffer layers, but is not limited thereto.

With this configuration, a portion of the light-emitting units 111 on the carrier substrate 11 can easily be selected to transfer to the driving substrate 20. For example, by way of adhesion, the two substrates 11 and 20 may be attached to each other to transfer the light-emitting units 111, due to different heights of the buffer layer 1100 in different regions 1100A to 1100D, the first transferred light-emitting units T1 can be transferred to a specific area of the driving substrate 20. Then the second transferred light-emitting units T2, the third transferred light-emitting units T3 and the fourth transferred light-emitting units T4 are sequentially transferred to others specific areas of the driving substrate 20.

Figure 4B:
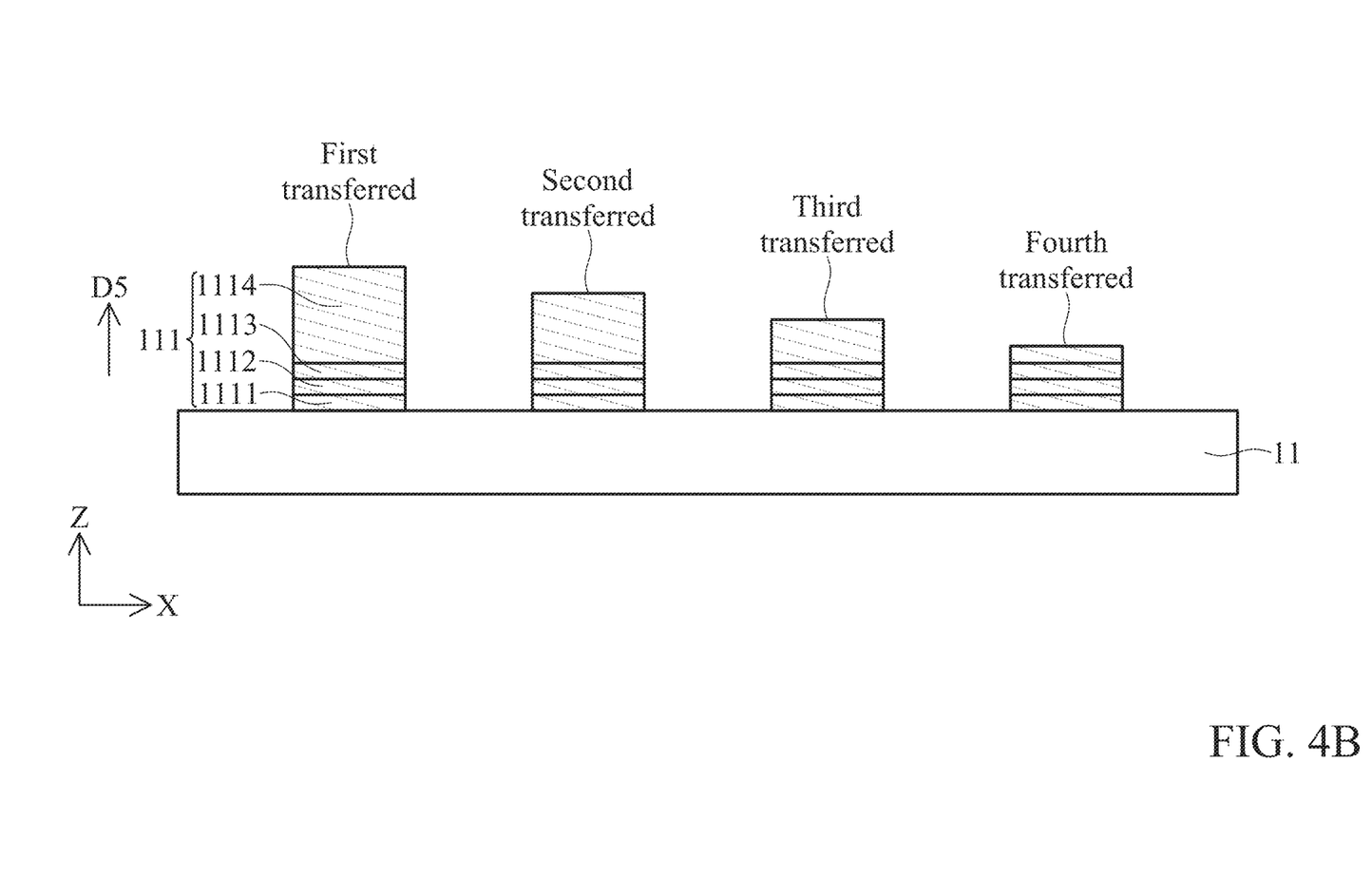
FIG. 4B is a schematic diagram of the light-emitting units having different heights.

In some embodiments, light-emitting units labeled "First transferred", "Second transferred", "Third transferred", and "Fourth transferred" may have different heights in the Z-axis by different way. As shown in FIG. 4B, light-emitting units 111 has multiple layers: a p-type semiconductor layer 1111, a multiple quantum well (MQW) layer 1112, an n-type semiconductor layer 1113, and an i-type semiconductor layer 1114, wherein the i-type semiconductor layer 1114 is located at the top portion of the light-emitting units 111. In the present embodiment, the i-type semiconductor layer 1114 of the light-emitting unit labeled "First transferred" is thicker than the i-type semiconductor layer 1114 of the light-emitting unit labeled "Second transferred". In the present embodiment, the i-type semiconductor layer 1114 of the light-emitting unit labeled "Second transferred" is thicker than the i-type semiconductor layer 1114 of the light-emitting unit labeled "Third transferred". In the present embodiment, the i-type semiconductor layer 1114 of the light-emitting unit labeled "Third transferred" is thicker than the i-type semiconductor layer 1114 of the light-emitting unit labeled "Fourth transferred". Therefore, with this configuration, it is possible to achieve an efficient transfer, which the light-emitting units can be easily to select with the different heights.

Fifth Embodiment

Figure 5:
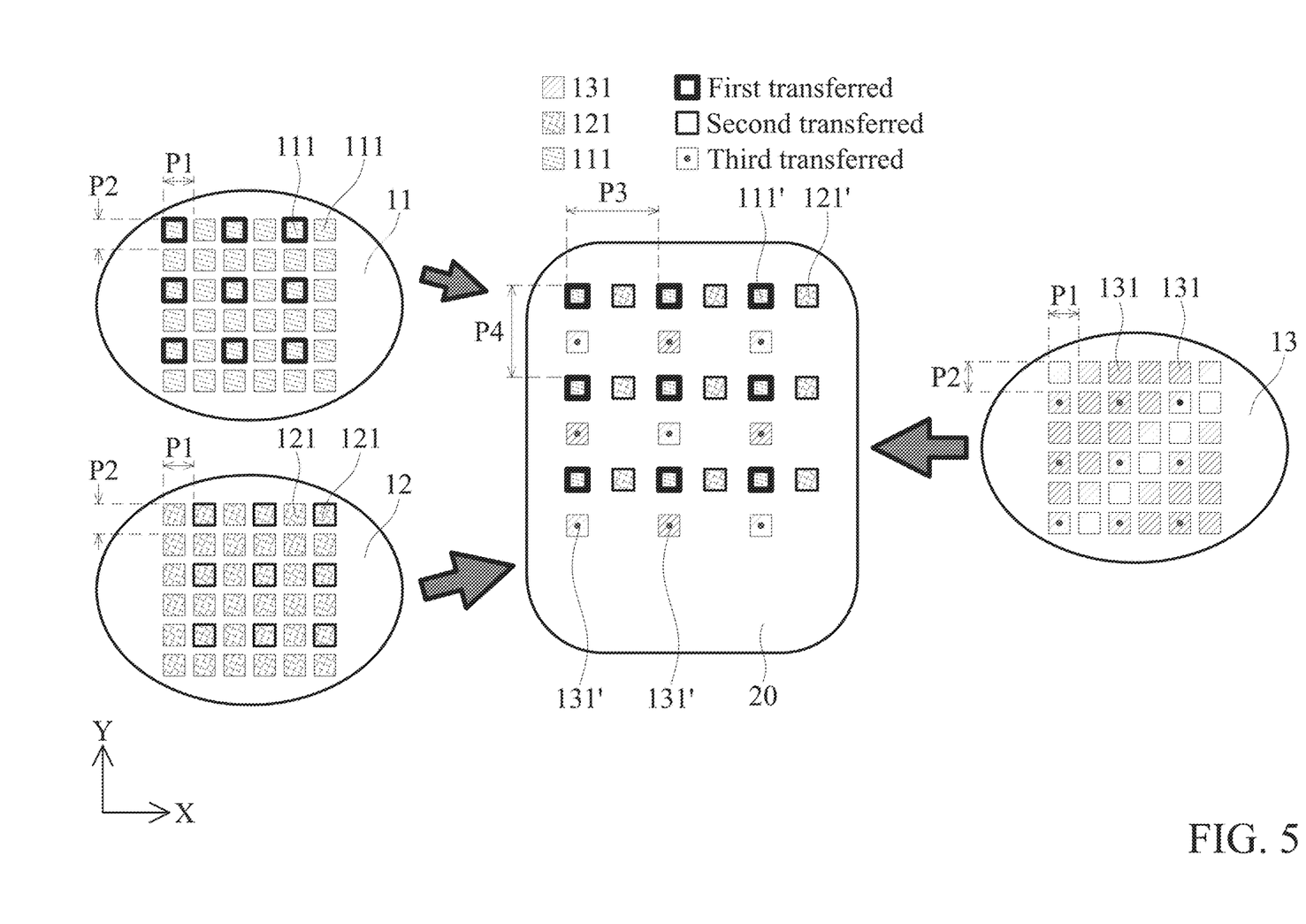
FIG. 5 is a schematic diagram of the light-emitting units transferred to the driving substrate from the carrier substrates according to another embodiment of the present disclosure.

FIG. 5 shows a plurality of the light-emitting units 111, 121 and 131 on the carrier substrates 11, 12 and 13 are transferred to the driving substrate 20. The different carrier substrates 11 to 13 may sustain different types of light-emitting units. For example, the light-emitting units 111 may be (but not limit to) red light-emitting units; the light-emitting units 121 may be green light-emitting units; and the light-emitting units 131 may be blue light-emitting units. The different light-emitting units 111, 121 and 131 are depicted with different types of diagonal lines for clarity. The selected light-emitting units 111 (or 121, 131) to be transferred are represented by different frame lines relative to the unselected light-emitting units 111 (or 121, 131).

A portion of the same light-emitting units 111(121 or 131) on the carrier substrate 11(12 or 13) is transferred to the driving substrate 20 to become the light-emitting units 111' (121' or 131'), wherein the pitches P1 and P2 is less than the pitches P3 and P4 for same type of the light-emitting units 111(121 or 131). In this embodiment, P3=2P1, and P4=2P2.

In some embodiments, the light-emitting units 111 are blue light-emitting units, the light-emitting units 121 are green light-emitting units, and the light-emitting units 131 are red light-emitting units. The light-emitting units 131 are transferred to the driving substrate 20 after the light-emitting units (111 and 121), due to the red light-emitting units are thicker than the blue and green light-emitting units. Therefore, the situation of the impact during transfer can be effectively decreased. In this embodiment, since the transferring member 30 may select the light-emitting units (111, 121 and 131) at different positions on different carrier substrates (11, 12 and 13) and transfer to the driving substrate 20, the transferring member 30 can correctly place the light-emitting units as long as the transferring member 30 correspond to a fixed position of the driving substrate 20. Furthermore, the transferring member 30 can also select the light-emitting units (111, 121 and 131) at the same position on different carrier substrates (11, 12 and 13) and transfer to the driving substrate 20. At this time, the transferring member 30 can correctly place the light-emitting units (111, 121 and 131) on the driving substrate 20 as long as there is a displacement corresponding to the fixed position of the driving substrate 20.

In addition, in order to make an electronic device with a larger size, the light-emitting units can be arranged on the temporary carrier substrate by using the method in Fifth Embodiment, and then transferred to the driving substrate by using the method in First Embodiment.

Sixth Embodiment

Figure 6:
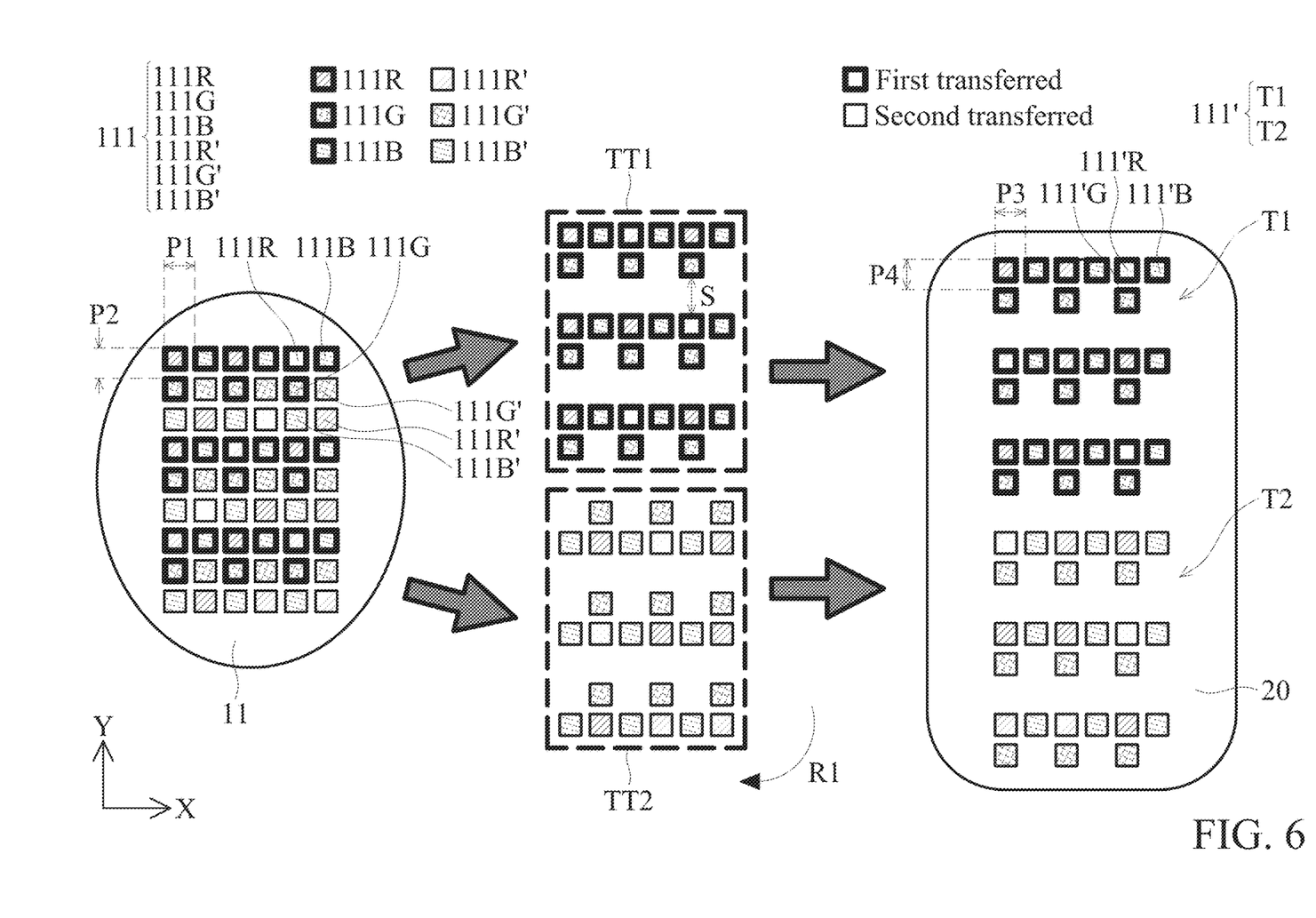
FIG. 6 is a schematic diagram of the light-emitting units transferred to the driving substrate from the carrier substrate according to another embodiment of the present disclosure.

FIG. 6 illustrates the light-emitting units 111 transferred to the driving substrate 20 according to another embodiment of the present disclosure. The light-emitting units 111 include different types (such as different colors) of light-emitting units 111R, 111G and 111B, which are depicted with different types of diagonal lines for clarity. The selected light-emitting units 111 to be transferred are represented by different frame lines relative to the unselected light-emitting units 111.

First, the method involves selecting a portion of the light-emitting units 111, labeled as First transferred, including light-emitting units 111R, 111G and 111B with a triangle arrangement, and being an assembled portion of the light-emitting units TT1, and then transferring the assembled portion of the light-emitting units TT1 to the driving substrate 20 as the first transferred light-emitting units T1 (including light-emitting units 111'R, 111'G and 111'B), having pitches P3=P1 and P4=P2. Second, the method involves selecting another portion of the light-emitting units 111, labeled as Second transferred, including units 111R', 111G' and 111B', and being an assembled portion of the light-emitting units TT2, and then rotating the assembled portion of the light-emitting units TT2 by 180 degrees around the rotating direction R1 and transferring the assembled portion of the light-emitting units TT2 to the driving substrate 20 as the second transferred light-emitting units T2, having pitches P3=P1 and P4=P2.

FIG. 6 illustrates a space S which is existed in the assembled portion of the light-emitting units TT1 and TT2. If the light-emitting units via the first transfer can be divided into three times and transfers to a temporary carrier substrate respectively, the space can be removed. And then the light-emitting units on the temporary carrier substrate can be transferred to the driving substrate 20 by the transfer method as shown in First Embodiment.

Seventh Embodiment

Figure 7A:
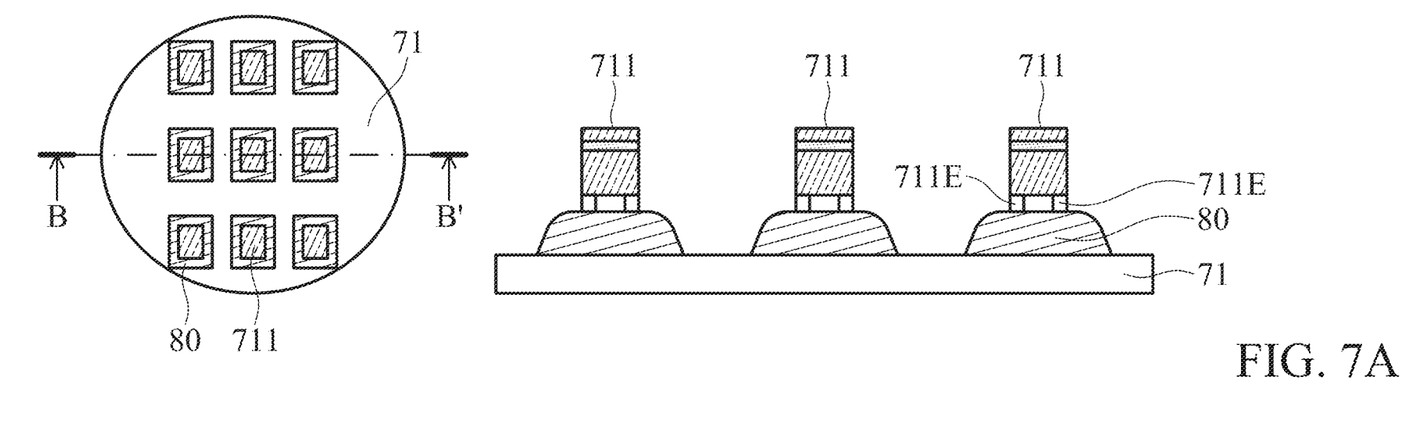
FIGS. 7A to 7E are schematic diagrams of the light-emitting units transferred to the driving substrate from the carrier substrates according to another embodiment of the present disclosure.

FIGS. 7A to 7E illustrate a way of light-emitting units 711 transferred to a driving substrate 20 according to another embodiment of the present disclosure. The light-emitting units 711 may be single color light-emitting units or integrated light-emitting units (such as RGB LED). As shown in FIG. 7A, from a cross-section view along the line B-B', there is a sacrificial layer 80 between a carrier substrate 71 and the light-emitting units 711. The sacrificial layer 80 may have a taper-shaped formed through a photolithography process, and may mainly comprise a photoresist material, for example, including a positive photoresist, such as phenol-formaldehyde resin or epoxy resin, or including a negative photoresist, such as polyisoprene rubber. The sacrificial layer 80 may also be formed through a photolithography process and chemical etchant processes, which may have inorganic material, such as including (but is not limited to) silicon nitride, silicon oxide, silicon oxynitride, or aluminum oxide, or may have an organic material, such as including (but is not limited to) epoxy resins, acrylic resins such as polymethylmetacrylate (PMMA), benzocyclobutene (BCB), polyimide, and polyester, polydimethylsiloxane (PDMS), or polyfluoroalkoxy (PFA).

Figure 7B:
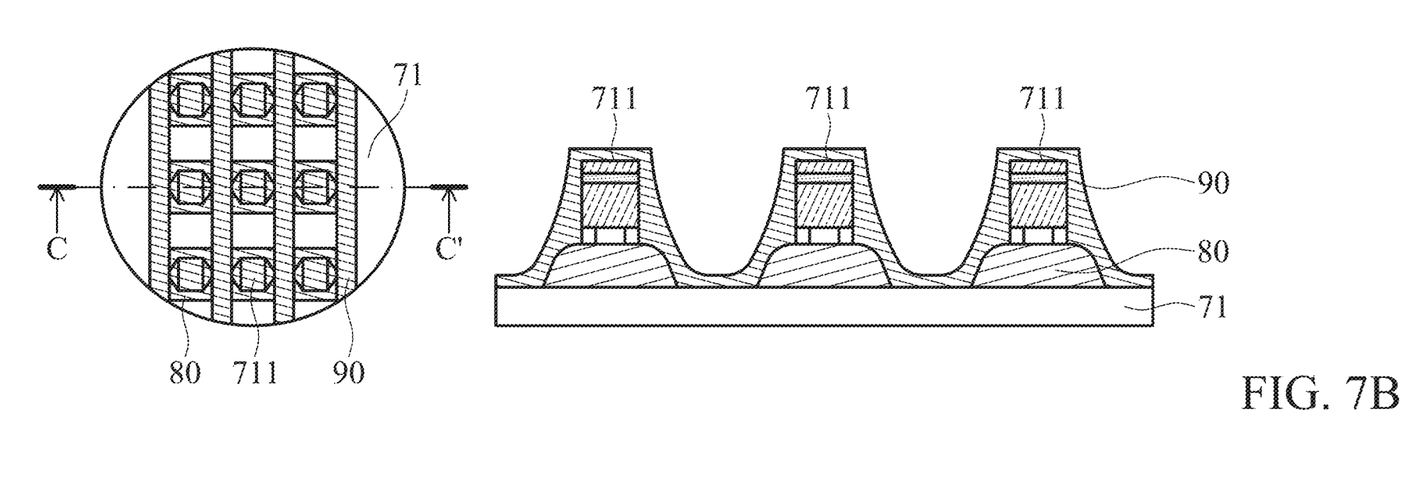

Referring to FIG. 7B shown as a top view and a cross-section view along the line C-C', a holding layer 90 is provided over the light-emitting units 711 to hold the light-emitting units 711, wherein the holding layer 90 also covers the sacrificial layer 80 and a portion surface of the carrier substrate 71 between the two adjacent light-emitting units 711. The holding layer 90 primarily includes inorganic materials such as SiOx, SiNx, SiOxNy, AlOx, or metal.

Figure 7C:
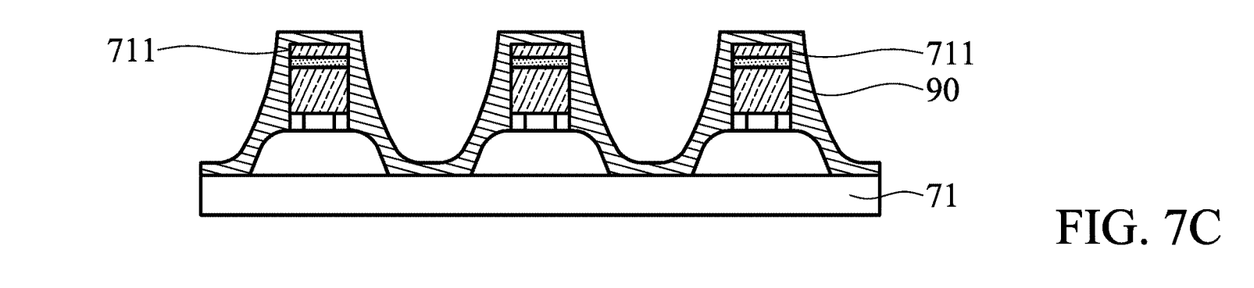
Figure 7D:
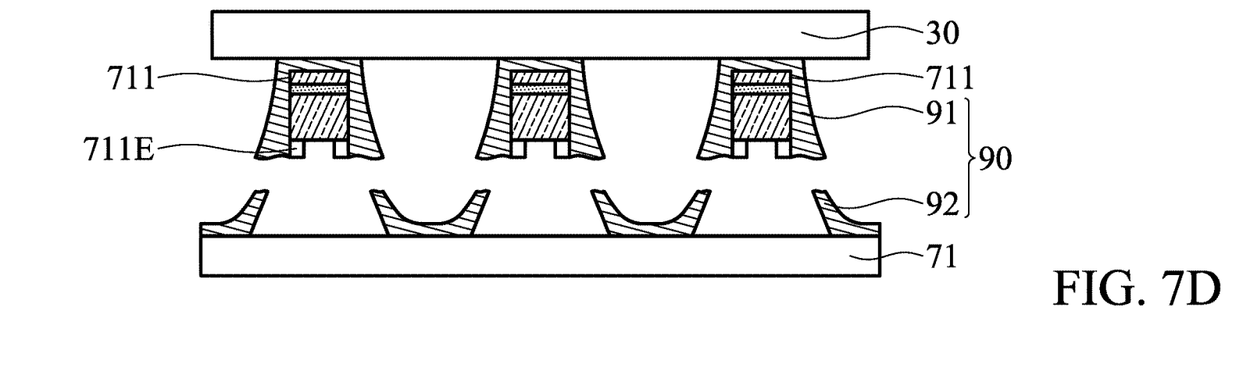

Referring to FIG. 7C, the sacrificial layer 80 is etched in a wet etching process. The light-emitting units 711 are held by the holding layer 90. After then, as shown in FIG. 7D, the holding layer 90 with the light-emitting units 711 is held by a transferring member 30. The transferring member 30 may have a vacuum adsorption head, a gripping head, a magnetic head, a viscous film (such as a PDMS (polydimethylsiloxane) soft film or a PMMA (polymethylmethacrylate) soft film), or other appropriate transferring members, and the holding layer 90 fractures at a weak portion, e.g. a neck portion (the portion that does not cover any light-emitting unit 711 in the normal direction of the carrier substrate 71), to form a first portion 91 (grabbed by the transferring member 30) and a second portion 92 (still disposed on the carrier substrate 71), and the first portion 91 first portion 901 of the holding layer 90 and the light-emitting units 711 are separated from the carrier substrate 71.

Figure 7E:
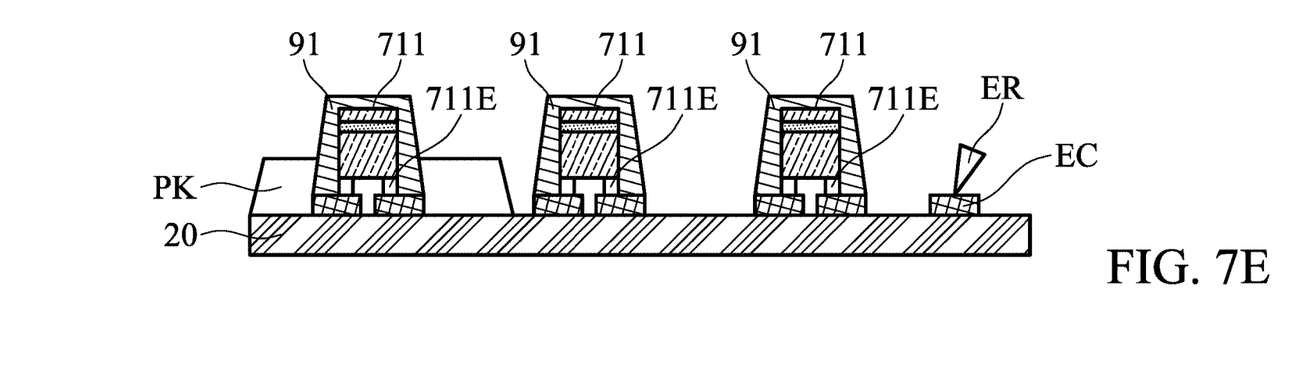

Referring to FIG. 7E, the transferring member 30 places the light-emitting units 711 on the driving substrate 20, wherein the light-emitting units 711 are connected to a conductive layer EC. A conductive test is performed via a testing member ER to identify the bonding quality of the light-emitting units 711. In some embodiments, the lower surface of the first portion 91 may be higher than or equal to the lower surface of the electrodes 711E of the light-emitting units 711. And, the first portion 91 will couple to the electrodes 711E, thereby improving product yield. After the testing is passed, the connection between the light-emitting units 711 and the conductive layer EC is covered by a package member PK, and at least a portion of the light-emitting units 711 are compassed by the package member PK. In some embodiments, the first portion 91 can be fully covered by the package member PK to achieve good encapsulation.

It should be noted that the features of the various embodiments can be combined and used as long as they do not violate or conflict the scope of the disclosure.

In summary, the present disclosure provides a method of manufacturing an electronic device. The embodiment of the present disclosure has at least one of the following advantages or effects. The pitches (P3 and P4) can be changed, which are larger than or equal to the pitches (P1 and P2). Therefore, the pitch of a large number of the light-emitting units can be rapidly adjusted, or the transfer efficiency can be increased, or the manufacturing process is improved.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be apparent to those skilled in the art that various modifications and variations can be made in the disclosure. It is intended that the standard and examples be considered as exemplary only, with the true scope of the disclosed embodiments being indicated by the following claims and their equivalents.

What is claimed is:

1. A method of manufacturing an electronic device, comprising:

providing a carrier substrate with a plurality of light-emitting units disposed thereon, the plurality of light-emitting units being spaced with a first pitch (P1) in a first direction and a second pitch (P2) in a second direction perpendicular to the first direction;

providing a tether layer over the plurality of light-emitting units;

providing a driving substrate; and transferring at least a portion of the plurality of light-emitting units to the driving substrate to form a transferred portion of the plurality of light-emitting units on the driving substrate, the transferred portion being spaced with a third pitch (P3) in a third direction and a fourth pitch (P4) in a fourth direction perpendicular to the third direction;

wherein the first pitch (P1), the second pitch (P2), the third pitch (P3), and the fourth pitch (P4) are satisfied following relations:

P3=mP1,

P4=nP2, m and n are positive integers, and wherein the tether layer fractures to form a first portion and a second portion, the first portion of the tether layer holds at least the portion of the plurality of the light-emitting units to separate from the second portion of the tether layer disposed on the carrier substrate.

2. The method of manufacturing the electronic device according to claim 1, wherein the step of transferring at least the portion of the plurality of light-emitting units is by non-selective transfer.

3. The method of manufacturing the electronic device according to claim 1, wherein the step of transferring at least the portion of the plurality of light-emitting units is by selective transfer.

4. The method of manufacturing an electronic device according to claim 1, further comprising:

providing a transferring member for transferring at least the portion the plurality of light-emitting units from the carrier substrate to the driving substrate, wherein the transferring member carries at least the portion the plurality of light-emitting units to separate from the carrier substrate; and placing at least the portion of the plurality of light-emitting units on the driving substrate by the transferring member.

5. The method of manufacturing an electronic device according to claim 4, comprising:

grabbing at least the portion of the plurality of light-emitting unit with the tether layer on the carrier substrate via the transferring member, wherein the first portion of the tether layer holding the light-emitting units is grabbed by the transferring member.

6. The method of manufacturing an electronic device according to claim 4, wherein the tether layer includes an inorganic material.

7. The method of manufacturing an electronic device according to claim 1, wherein m and n are equal to 1.

8. The method of manufacturing the electronic device according to claim 1, wherein at least one of m and n is greater than 1.

9. The method of manufacturing the electronic device according to claim 8, wherein m is equal to n.

10. The method of manufacturing the electronic device according to claim 8, wherein m is different with n.

* * * * *